United States Patent [19]

Molinari

[11] 4,160,210
[45] Jul. 3, 1979

[54] PRINTED CIRCUIT IMPEDANCE TRANSFORMATION NETWORK WITH AN INTEGRAL SPARK GAP

[75] Inventor: Thomas E. Molinari, Indianapolis, Ind.

[73] Assignee: RCA Corporation, New York, N.Y.

[21] Appl. No.: 829,169

[22] Filed: Aug. 30, 1977

[51] Int. Cl.² .............................................. H04B 1/18
[52] U.S. Cl. .................................. 325/362; 325/380; 325/381; 333/26; 333/33; 361/119
[58] Field of Search ............... 325/376, 377, 380, 381, 325/386, 362, 106, 150; 361/112, 117, 119, 118, 91; 333/26, 33; 343/701

[56] References Cited

U.S. PATENT DOCUMENTS

| 2,071,858 | 2/1937 | Smith | 325/386 |
|---|---|---|---|
| 2,876,342 | 3/1959 | Mattingly | 325/381 |
| 3,289,115 | 11/1966 | Carr | 333/31 |
| 3,312,868 | 4/1967 | Vodicka | 361/119 |
| 3,322,995 | 5/1967 | Hansen et al. | 361/118 |
| 3,654,511 | 4/1972 | Iwaya | 361/118 |
| 3,733,522 | 5/1973 | Simovits, Jr. et al. | 317/77 |
| 3,742,393 | 6/1973 | Karp | 333/10 |
| 3,754,197 | 8/1973 | Cristal | 333/33 |
| 3,846,721 | 11/1974 | Fritz et al. | 333/26 |
| 3,849,745 | 11/1974 | Schellenberg et al. | 333/31 |
| 3,865,452 | 2/1975 | Pittman | 339/14 T |
| 3,899,757 | 8/1975 | Nakagami et al. | 333/31 |
| 3,904,994 | 9/1975 | Bates et al. | 333/31 R |
| 3,968,411 | 7/1976 | Mueller | 325/362 |
| 3,990,024 | 11/1976 | Hou | 333/33 |

OTHER PUBLICATIONS

Flashover in Picture Tubes and Methods of Protection — A. Ciuciura — Mar. 1969 — The Radio And Electronic Engineer, pp. 149-168.

Primary Examiner—Robert L. Griffin
Assistant Examiner—Marc E. Bookbinder
Attorney, Agent, or Firm—Eugene M. Whitacre; Paul J. Rasmussen; Peter M. Emanuel

[57] ABSTRACT

A printed circuit board including a serpentine conductor formed thereon is mounted on a grounded metal chassis of the receiver's tuner so that the serpentine conductor and the grounded chassis form a transmission line for matching the impedances of the receiver's antenna network and tuner circuitry. Eyelets by which the serpentine conductor is connected to the antenna network and tuner circuitry extend through the dielectric material of the printed circuit into cutout areas in the chassis. Tabs extend from the peripheries of the cutout areas toward the eyelets to form spark gaps for discharging excessively high energies which may be induced by lightning.

10 Claims, 2 Drawing Figures

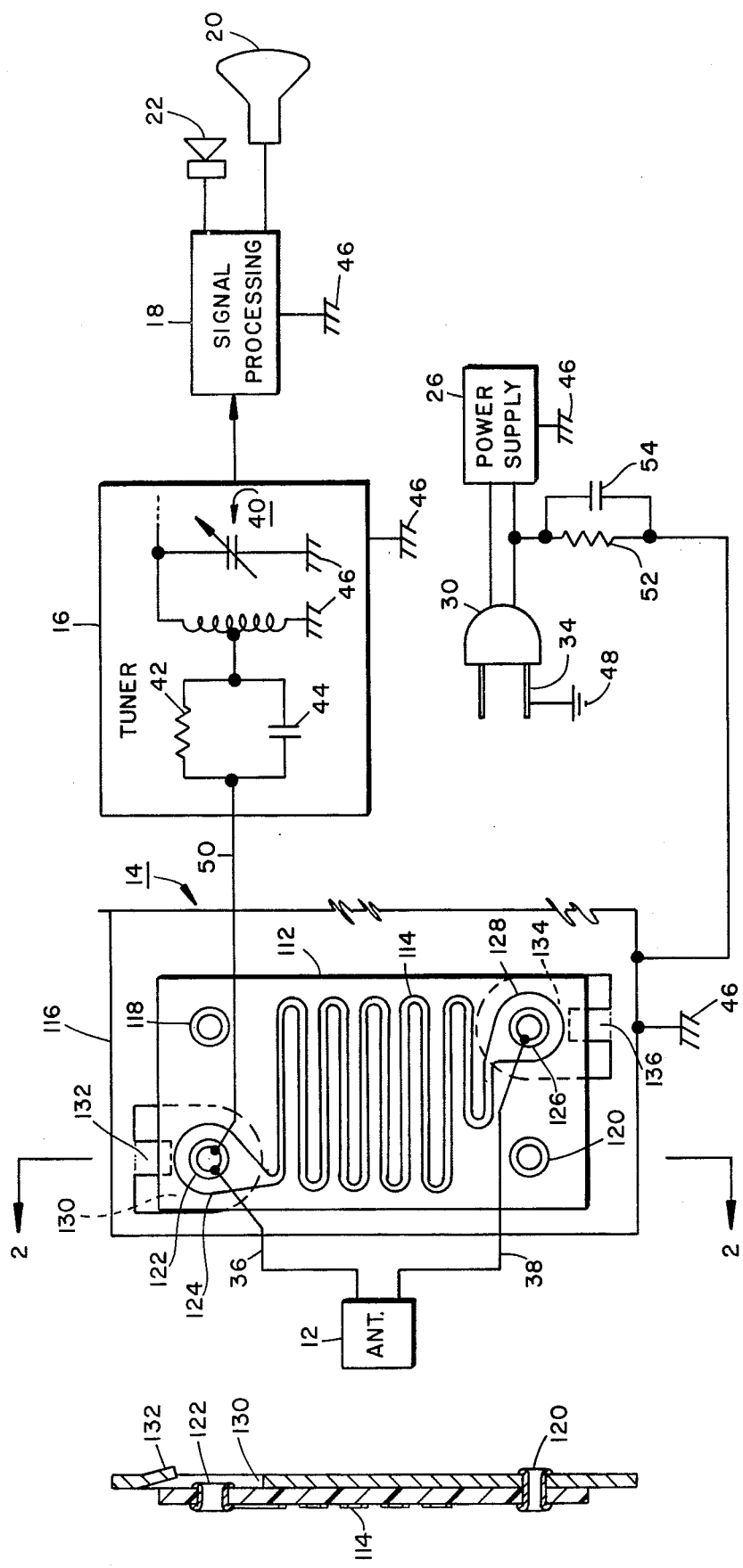

100000

PRINTED CIRCUIT IMPEDANCE TRANSFORMATION NETWORK WITH AN INTEGRAL SPARK GAP

BACKGROUND OF THE INVENTION

The present invention relates to the field of impedance transformation networks for matching the impedances of antenna networks to associated tuner circuits.

Impedance transformation networks, commonly referred to as Balun networks, are utilized to match the impedances of antennas to associated RF circuitry employed in tuners of television receivers. Traditionally these Balun networks have taken the form of transformer windings which tend to be relatively bulky, difficult to manufacture and expensive. To overcome these deficiencies, Balun networks including a printed circuit board having a strip-like conductor and a ground conductor arranged with respect to each other so as to form a transmission line with the proper characteristics to match the impedances of antenna networks and RF tuner circuitry have been proposed because of their relative compactness, ease of manufacture and cost effectiveness.

Not only is it desirable that a Balun network provide the impedance matching functions set forth above, but it is also desirable that a Balun network include provisions which isolate the receiver from excessively high energies which may be induced by lightning.

SUMMARY OF THE PRESENT INVENTION

A Balun network for matching the impedance of an antenna network to the impedance of associated tuner circuitry and for discharging excessively high voltages which may be induced by lightning includes a circuit board having a first conductor formed thereon. A second conductor is located with respect to the first conductor so that the first and second conductors form a transmission line having the desired impedance matching characteristics. At least one portion of the first conductor is spaced from the second conductor so as to form a spark gap for discharging excessively high energies.

BRIEF DESCRIPTION OF THE DRAWING

FIG. 1 shows a plan view of a printed circuit Balun network formed in accordance with the present invention as it may be employed in a television receiver; and FIG. 2 shows a cross-sectional view of the printed circuit Balun network shown in FIG. 1 taken in the direction of section lines 2—2 of FIG. 1.

DETAILED DESCRIPTION OF THE INVENTION

In the receiver shown in FIG. 1, RF signals are received by an antenna 12 and coupled through a Balun network 14 to a tuner 16. Tuner 16 converts the RF signals into an IF signal having modulated carriers representing picture and sound information. The IF signal is coupled to a signal processing unit 18 which processes the picture and sound components of the IF signal so that a picture is produced by means of a kinescope 20 and an audio response is produced by means of a speaker 22.

A power supply 26 converts AC line power coupled to the receiver by means of a power plug 30 to DC supply voltages required by various portions of the receiver. For reasons of safety, power supply 26 includes an isolation transformer (not shown) so that chassis ground 46, to which the signals processed by Balun 14, tuner 16 and signal processing unit 18 are referenced, is isolated from earth ground 48 which is coupled to the receiver by means of a ground prong 34 of power plug 30.

During the following description of Balun 14, it will be helpful to refer to FIGS. 1 and 2 concurrently. Balun 14 includes a circuit board 112 formed of a dielectric material on one side of which is formed a serpentine conductor 114 by any one of a number of well-known printed circuit board manufacturing techniques. Circuit board 112 is mounted on a portion of the metal chassis enclosing tuner 16 by means of eyelets 118 and 120 which pass through both circuit board 112 and chassis 116. Chassis 116 is connected to chassis ground 46. Conductor pads 124 and 128 define the ends of serpentine conductor 114. Eyelets 122 and 126 pass through pads 124 and 128 and circuit board 112 and extend into areas 130 and 134 cut out of chassis 116, respectively. Tabs 132 and 136 extend inward from straight portions of the peripheries of cutout areas 130 and 134 toward eyelets 122 and 126, respectively, to form spark gaps. Tabs 132 and 136 are bent away from the surface of printed circuit board 112. Leads 36 and 38 from antenna network 12 are soldered to eyelets 122 and 126, respectively. Lead 50 from tuner 16 is also soldered to eyelet 122.

The RF signals coupled to Balun 14 through leads 36 and 38 are balanced. This means that they have equal magnitudes with respect to signal (i.e., chassis) ground but are out of phase by 180°. Serpentine line conductor 114 in conjunction with the ground plane provided by chassis 116 forms a transmission line which shifts the phase of the RF signal carried by conductor 38 so that it is in phase with the RF signal carried by lead 36. As a result, the impedance at eyelets 122 and 126 due to antenna network 12 is in effect coupled in parallel between eyelet 122 and chassis ground 46. Therefore, the value of the impedance between eyelet 122 and chassis ground 46, i.e., the unbalanced impedance provided by Balun 14 to tuner 16, is one half the value of each of the impedances between lead 36 and chassis ground and lead 38 and chassis ground at the output of antenna network 12; or one quarter the value of the balanced impedance between lead 36 and lead 38 at the output of antenna network 12. The value of the input impedance of tuner 16 between lead 50 and chassis ground 46 is selected so as to approximately equal the value of the unbalanced impedance provided by Balun 14 to optimize the transfer of power between antenna network 12 and tuner 16. Thus, Balun 14 serves to transform the balanced impedance provided by antenna network 12 into an unbalanced impedance having a value which matches the value of the input impedance of tuner 16.

Therefore, Balun 14 may be desirably employed, for example, to couple a balanced 300 ohm UHF antenna network to a tuner having an input impedance of 75 ohms. Conductor 114 is formed in a serpentine pattern (rather than in a straight line) so that it provides a 180° phase shift over a relatively broad bandwidth, e.g., from 470 MHz to 890 MHz, suitable for the reception of UHF signals. Conductor 114 is also made serpentine so as to minimize the size of Balun 14. Additionally, the serpentine pattern is beneficial because it allows eyelets 122 and 126 to be spaced relatively close together so as to be able to receive twin lead-in antenna cable conventionally employed in antenna systems without having to separate the conductors thereof thereby undesirably altering its transmission characteristics.

If lightning should strike antenna network 12 or in its vicinity, excessively high energies may be developed at either antenna lead 36 or 38. These energies will be coupled to eyelets 122 or 126. Eyelet 122 and tab 132 form a spark gap to discharge excessively high energies at antenna lead 36, and eyelet 126 and tab 136 form a spark gap to discharge excessively high energies at antenna lead 38. When the spark gaps fire, discharge currents are produced which flow to earth ground 48 through a capacitor 54 coupled between chassis 116 and prong 34 of power plug 30. Capacitor 54 may be replaced by a spark gap if so desired.

Tabs 132 and 134 are bent away from the surface of circuit board 112 so that the discharge arcs formed when the spark gaps fire do not come in contact with the circuit board 112 thereby undesirably causing a carbonized track to be formed thereon between chassis 116 and eyelets 122 and 126 which may eventually short the spark gaps. It will also be noted that for this purpose the straight line portions of the peripheries of cutout areas 130 and 134 of chassis 116 are spaced away from the edges of circuit board 112 and the curved line portions of the peripheries of cutout areas 130 and 134 have circular shapes so as to be uniformly spaced from eyelets 122 and 126. In addition, also for the same purpose, it is desirable to locate mounting eyelets 118 and 120 which hold circuit board 112 in contact with chassis 116 far enough away from serpentine conductor 114 so that arcs are not formed between conductor 114 and eyelets 118 and 120. Furthermore, to insure the proper registration of eyelets 122 and 126 within the peripheries of cutout areas 130 and 134, the holes in chassis 116 through which eyelets 118 and 120 pass and cutout areas 130 and 134 are punched by a one-piece die and the holes in circuit board 112 through which eyelets 118, 120, 122 and 126 pass are punched by another one-piece die.

It is possible that although lightning has not struck antenna network 12, high energies may be developed at antenna leads 36 and 38 because the atmosphere surrounding it is highly charged, such as when a low cloud surrounds it. Generally, such high energies will not be high enough to cause the spark gaps of Balun 14 to fire and therefore undesirably remain at antenna leads 36 and 38. To discharge these energies, a relatively large value resistor 42 is coupled between eyelet 122 and a coil 56 of a tuned input circuit 40 of tuner 16. A DC path to earth ground 48 to drain off any high charges developed at antenna leads 36 and 38 is thereby provided because coil 56 is connected to chassis ground 46 which in turn is coupled to earth ground 48 through a relatively high value resistor 52 and prong 34 of power plug 30. A capacitor 44 is coupled in parallel relationship with resistor 42 to couple RF signals between Balun 14 and tuned circuit 40 in the normal operation of the receiver. The parallel resistor-capacitor networks including resistors 42 and capacitor 44 and resistor 52 and capacitor 54 may conveniently comprise single elements called "capristors" because they exhibit similar characteristics to that of the parallel combination of a resistor and capacitor.

Although in the embodiment of the present invention shown in FIGS. 1 and 2, circuit board 112 is attached to chassis 116 by means of eyelets because leads may easily be inserted in their holes, other types of fasteners such as rivets may be utilized. Furthermore, in the embodiment shown in FIGS. 1 and 2, although the ground plane of the transmission line of Balun 14 is provided by the attachment of circuit board 112 to chassis 116, other types of ground planes may be employed. For example, the ground plane may take the form of a second conductor on the surface of circuit board 112 opposite the serpentine conductor 114. In this case, terminal posts would extend from conductor pads 124 and 128 through circuit board 112 to cutout areas in the second conductor. It is noted, however, that chassis 116 makes a desirable ground plane since it is sturdy enough to support Balun 14 and conduct the discharge currents to earth ground 48.

What is claimed is:

1. Apparatus for coupling an antenna network to an RF signal processing circuit, comprising:
   a printed circuit board having a first conductor formed on one side thereof and coupled between said antenna network and said signal processing circuit;
   a second conductor comprising a planar metal member positioned in a fixed relationship with respect to said first conductor to form a transmission line having characteristics selected to match the impedances of said antenna network and said RF signal processing circuit; and
   discharging means including a third conductor extending from one of said first and second conductors toward the other of said first and second conductors to form a spark gap therebetween for discharging excessively high energies developed at said antenna network.

2. The apparatus recited in claim 1 wherein
   said second conductor is attached to the side of said circuit board opposite the side on which said first conductor is formed and has at least one cutout area formed therein; and
   said discharging means includes at least one terminal means extending from said first conductor through said circuit board and into said cutout area.

3. The apparatus recited in claim 2 wherein
   said discharging means includes a tab extending from the periphery of said cutout area toward said terminal means.

4. The apparatus recited in claim 3 wherein
   said tab is bent away from said circuit board.

5. The apparatus recited in claim 4 wherein
   said metal member comprises a chassis enclosing at least a portion of said RF signal processing circuit.

6. The apparatus recited in claim 5 wherein
   a first terminal means defines one end of said transmission line and a second terminal means defines the second end of said transmission line, said first and second terminal means being coupled to said antenna network, said first terminal means also being coupled to said RF signal processing circuit, said first terminal means extending into a first cutout area formed in said chassis, said second terminal means extending into a second cutout area formed in said chassis, a first tab extending from the periphery of said first cutout area toward said first terminal means to form a first spark gap, a second tab extending from the periphery of said second cutout area toward said second terminal means to form a second spark gap.

7. The apparatus recited in claim 6 wherein
   said first conductor has a serpentine pattern.

8. The apparatus recited in claim 7 wherein said circuit board is attached to said chassis by fastener means, said fastener means being relatively remotely spaced from said first conductor with respect to the distance between said first terminal means and said first tab and the distance between said second terminal means and said second tab.

9. The apparatus recited in claim 8 wherein the periphery of said first cutout area includes a circular portion uniformly positioned with respect to said first terminal means and a straight line portion from which said first tab extends which does not come in contact with said circuit board; and the periphery of said second cutout area includes a circular portion uniformly positioned with respect to said second terminal means and a straight line portion from which said second tab extends which does not come in contact with said circuit board.

10. The apparatus recited in claim 9 wherein said first and second terminal means comprise eyelets.

* * * * *